United States Patent
Soltanian et al.

(10) Patent No.: US 7,940,111 B2
(45) Date of Patent: May 10, 2011

(54) HIGH-PERFORMANCE ANALOG SWITCH

(75) Inventors: Babak Soltanian, San Jose, CA (US);
Hong Sun Kim, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 78 days.

(21) Appl. No.: 12/262,116

(22) Filed: Oct. 30, 2008

(65) Prior Publication Data
US 2010/0109751 A1 May 6, 2010

(51) Int. Cl.
*H03K 17/00* (2006.01)
(52) U.S. Cl. .......................................... 327/403
(58) Field of Classification Search .................. 327/403, 327/404, 427
See application file for complete search history.

(56) References Cited

U.S. PATENT DOCUMENTS

| | | | | |
|---|---|---|---|---|
| 3,866,064 A | * | 2/1975 | Gregory et al. | 327/437 |
| 4,518,880 A | * | 5/1985 | Masuda et al. | 327/383 |
| 6,163,199 A | * | 12/2000 | Miske et al. | 327/434 |
| 6,279,145 B1 | * | 8/2001 | Wong | 716/17 |
| 6,462,611 B2 | * | 10/2002 | Shigehara et al. | 327/534 |
| 6,552,576 B1 | * | 4/2003 | Bobba et al. | 326/113 |
| 7,095,266 B2 | * | 8/2006 | Miske | 327/427 |
| 7,554,382 B2 | * | 6/2009 | Miske et al. | 327/382 |
| 2002/0036576 A1 | | 3/2002 | Saito | |
| 2002/0145462 A1 | | 10/2002 | Ramakrishnan | |
| 2003/0058145 A1 | | 3/2003 | Saito | |
| 2003/0094993 A1 | | 5/2003 | Tsukazaki et al. | |
| 2003/0201818 A1 | | 10/2003 | Saito | |
| 2004/0119522 A1 | | 6/2004 | Tachibana et al. | |
| 2005/0046462 A1 | | 3/2005 | Steinhagen | |
| 2005/0139931 A1 | | 6/2005 | Arai | |
| 2007/0285149 A1 | | 12/2007 | Nakatani et al. | |

OTHER PUBLICATIONS

International Search Report and Written Opinion—PCT/US09/062873—International Search Authority, EPO—Feb. 2, 2010.

* cited by examiner

*Primary Examiner* — Hai L Nguyen
(74) *Attorney, Agent, or Firm* — Jiayu Xu

(57) ABSTRACT

Techniques for designing a high performance analog switch for use in electronic circuit applications. In one aspect, a variable bulk voltage generation module is provided to vary the bulk voltage of a transistor in the switch, such that the threshold voltage of the transistor is reduced during the on state. In another aspect, a pulling transistor is provided to pull a middle node of the switch to a DC voltage during the off state to further increase the isolation provided by the switch.

21 Claims, 4 Drawing Sheets

HIGH-PERFORMANCE ANALOG SWITCH

TECHNICAL FIELD

The disclosure relates to electronic circuits and, more particularly, to techniques for designing high-performance analog switches.

BACKGROUND

In the field of electronic circuit design, analog switches are used in a wide variety of applications, including, but not limited to, radio-frequency (RF) multiplexers, demultiplexers, passive mixers, switched-capacitor circuits, etc. Analog switches are designed to couple an analog signal at a first node to an analog signal at a second node. In an "on" state, the switch may directly couple an analog voltage or current at the first node to the second node, while in an "off" state, the switch may isolate the analog voltage or current at the first node from the second node.

In general, a high performance analog switch must meet several, possibly conflicting, design objectives. First, during the on state, the switch should provide low series impedance between the first and second nodes. Second, during the off state, the switch should provide a high series impedance between the first and second nodes. Furthermore, to minimize signal attenuation at high frequency, the switch should introduce minimal parasitic capacitance to the first and second nodes.

It would be desirable to provide novel and effective techniques to meet the objectives for designing a high performance analog switch.

SUMMARY

An aspect of the present disclosure provides an analog switch for coupling a first node to a second node during an on state, and for isolating the first node from the second node during an off state, the switch comprising first and second switch transistors, the first switch transistor coupling the first node to a middle node, the second switch transistor coupling the middle node to the second node, the switch further comprising: a bulk voltage generation module coupling the bulk node of at least one of the first and second switch transistors to a first bulk voltage during the on state, and to a second bulk voltage during the off state.

Another aspect of the present disclosure provides a method for coupling a first node to a second node during an on state, and for isolating the first node from the second node during an off state, the method comprising switching first and second switch transistors, the first switch transistor coupling the first node to a middle node, the second switch transistor coupling the middle node to the second node, the method further comprising: coupling the bulk node of at least one of the first and second switch transistors to a first bulk voltage during the on state; and coupling the bulk node of the at least one of the first and second switch transistors to a second bulk voltage during the off state.

Yet another aspect of the present disclosure provides an analog switch for coupling a first node to a second node during an on state, and for isolating the first node from the second node during an off state, the switch comprising first and second switch transistors, the first switch transistor coupling the first node to a middle node, the second switch transistor coupling the middle node to the second node, the switch further comprising: bulk voltage generation means for varying the threshold voltage of at least one of the first and second switch transistors to reduce the threshold voltage during the on state.

DETAILED DESCRIPTION

The detailed description set forth below in connection with the appended drawings is intended as a description of exemplary embodiments of the present invention and is not intended to represent the only exemplary embodiments in which the present invention can be practiced. The term "exemplary" used throughout this description means "serving as an example, instance, or illustration," and should not necessarily be construed as preferred or advantageous over other exemplary embodiments. The detailed description includes specific details for the purpose of providing a thorough understanding of the exemplary embodiments of the invention. It will be apparent to those skilled in the art that the exemplary embodiments of the invention may be practiced without these specific details. In some instances, well known structures and devices are shown in block diagram form in order to avoid obscuring the novelty of the exemplary embodiments presented herein.

Figure 1:
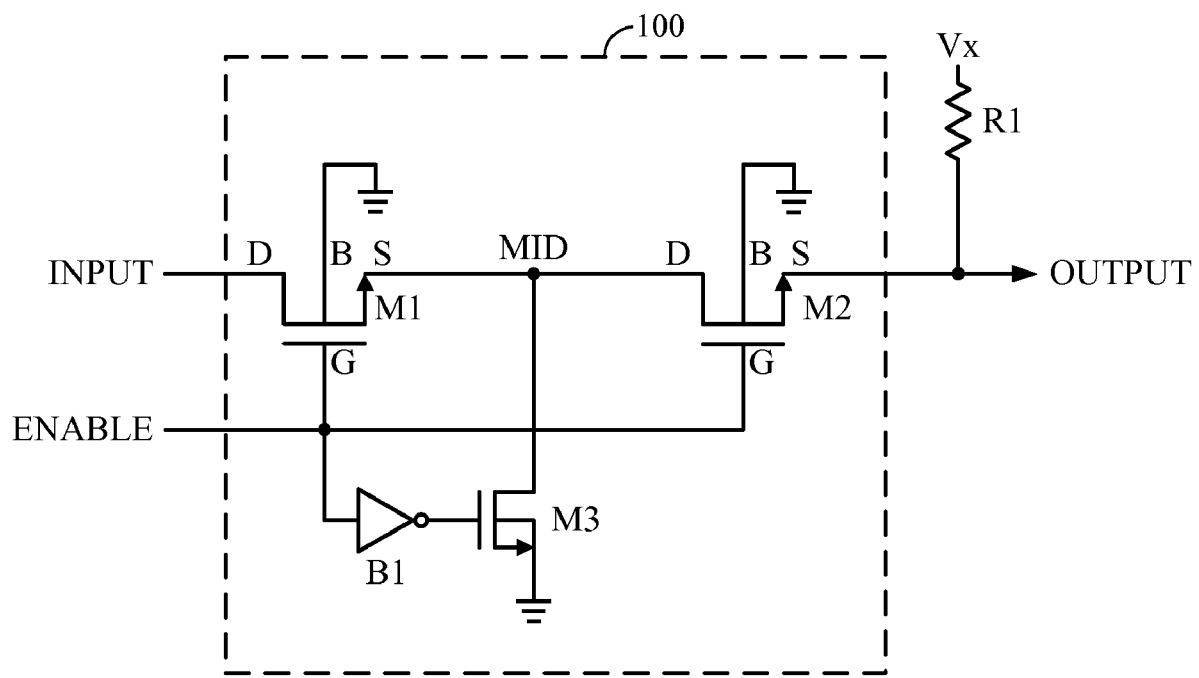
FIG. 1 depicts an implementation of a prior art switch 100.

FIG. 1 depicts an implementation of a prior art switch 100. Note the prior art switch 100 in FIG. 1 is shown for illustrative purposes only, and is not meant to restrict the scope of application of the techniques described in the present disclosure.

In FIG. 1, the switch 100 includes NMOS transistors M1 and M2. An ENABLE voltage is directly coupled to the gates of M1 and M2, turning M1 and M2 on when ENABLE is high, and turning M1 and M2 off when ENABLE is low. In the present disclosure, the "on state" corresponds to the state wherein ENABLE is high, while the "off state" corresponds to the state wherein ENABLE is low.

In FIG. 1, the ENABLE voltage further controls an NMOS transistor M3 via inverting buffer B1. M3 pulls the node MID between M1 and M2 to ground when ENABLE is low, and does not drive the node MID when ENABLE is high. A voltage Vx is provided through resistor R1 to DC bias the output of the switch 100.

One of ordinary skill in the art will appreciate that the switch 100 is designed to couple the output voltage OUTPUT to the input voltage INPUT when ENABLE is high, and to isolate OUTPUT from INPUT when ENABLE is low. As earlier described, it is desirable to provide a low series on-resistance between OUTPUT and INPUT when ENABLE is high, and conversely, to provide high series impedance between OUTPUT and INPUT when ENABLE is low. It is further desirable to present low parasitic capacitance to the OUTPUT and INPUT voltages when the switch is on.

Note in the prior art switch 100, the bulk (or substrate) nodes B of transistors M1 and M2 are both coupled to ground. When ENABLE is high, the source nodes S of the transistors M1 and M2 may approach the bias voltage Vx, resulting in negative bulk-to-source voltages Vbs for M1 and M2. One of ordinary skill in the art will appreciate that a negative bulk-to-source voltage generally increases the corresponding transistor threshold voltage, which decreases the overall gate overdrive voltage available to M1 and M2. This undesirably results in higher series on-resistance for M1 and M2 during the on state of the switch.

Figure 2:
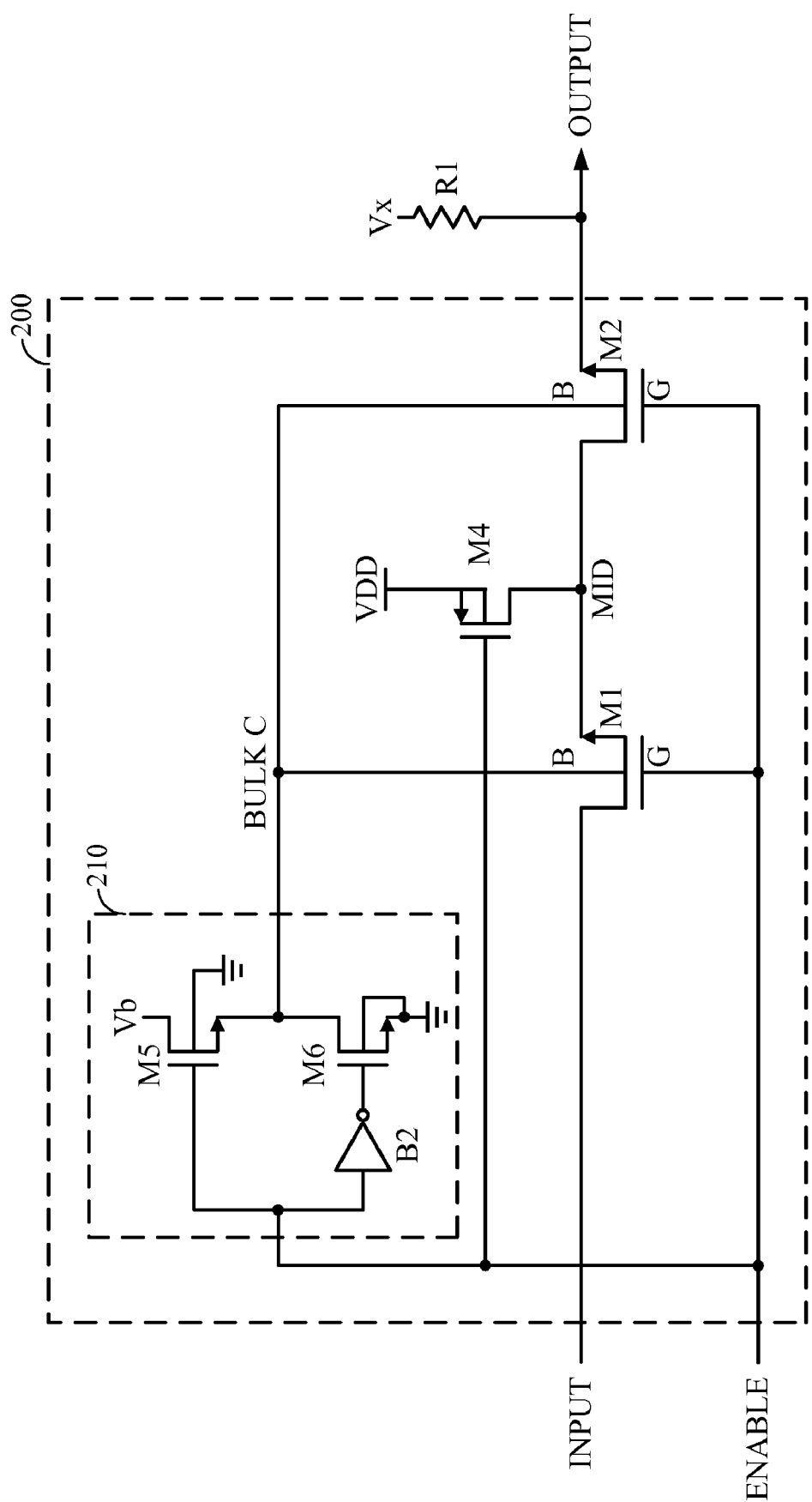
FIG. 2 depicts an embodiment of a switch 200 according to the present disclosure.

FIG. 2 depicts an embodiment of a switch 200 according to the present disclosure. In FIG. 2, the switch 200 includes NMOS transistors M1 and M2, whose gates are coupled to the ENABLE voltage. The ENABLE voltage further controls a PMOS transistor M4 coupled to the node MID between M1 and M2. M4 pulls MID high to the supply voltage VDD when ENABLE is low, and does not drive MID when ENABLE is high.

The bulk nodes B of M1 and M2 are both coupled to a bulk control voltage BULK_C generated by a bulk voltage generation module 210. The module 210 includes transistors M5 and M6. The gate of M5 is directly coupled to ENABLE, while the gate of M6 is coupled to ENABLE via an inverting buffer B2. When ENABLE is high, M6 is turned off, and M5 is turned on, thus coupling the voltage BULK_C to the voltage Vb at the drain of M5. When ENABLE is low, M5 is turned off, and M6 is turned on, thus coupling the voltage BULK_C to ground. One of ordinary skill in the art will appreciate that the configuration of M5 and M6 effectively raises the bulk voltage BULK_C of the switch transistors M1 and M2 to a level Vb when ENABLE is high. This acts to decrease the threshold voltage of M1 and M2 when the switch is on. In an exemplary embodiment, the level Vb may be set at half the supply voltage. Furthermore, the configuration of M4 effectively drives the node MID to a high voltage when ENABLE is off.

One of ordinary skill in the art having the benefit of the present disclosure will appreciate that the exemplary switch 200 depicted in FIG. 2 offers at least two advantages over the prior art switch 100 shown in FIG. 1.

First, the controlled voltage BULK_C results in a bulk-to-source voltage during the on state of switch 200 that is less negative than the corresponding bulk-to-source voltage of the prior art switch 100. This increases the gate overdrive voltage of M1 and M2 during the on state of switch 200, thereby decreasing the series resistance of the transistors. In an exemplary embodiment, small device aspect ratios for M1 and M2 may further be used to decrease the parasitic capacitances associated with M1 and M2 during the on state.

Second, the coupling of the node MID to a high voltage during the off state of switch 200 results in negative gate-to-source voltages for M1 and M2. This increases the series resistance of M1 and M2 during the off state of switch 200, and also reduces the associated parasitic capacitances of M1 and M2.

Figure 4:
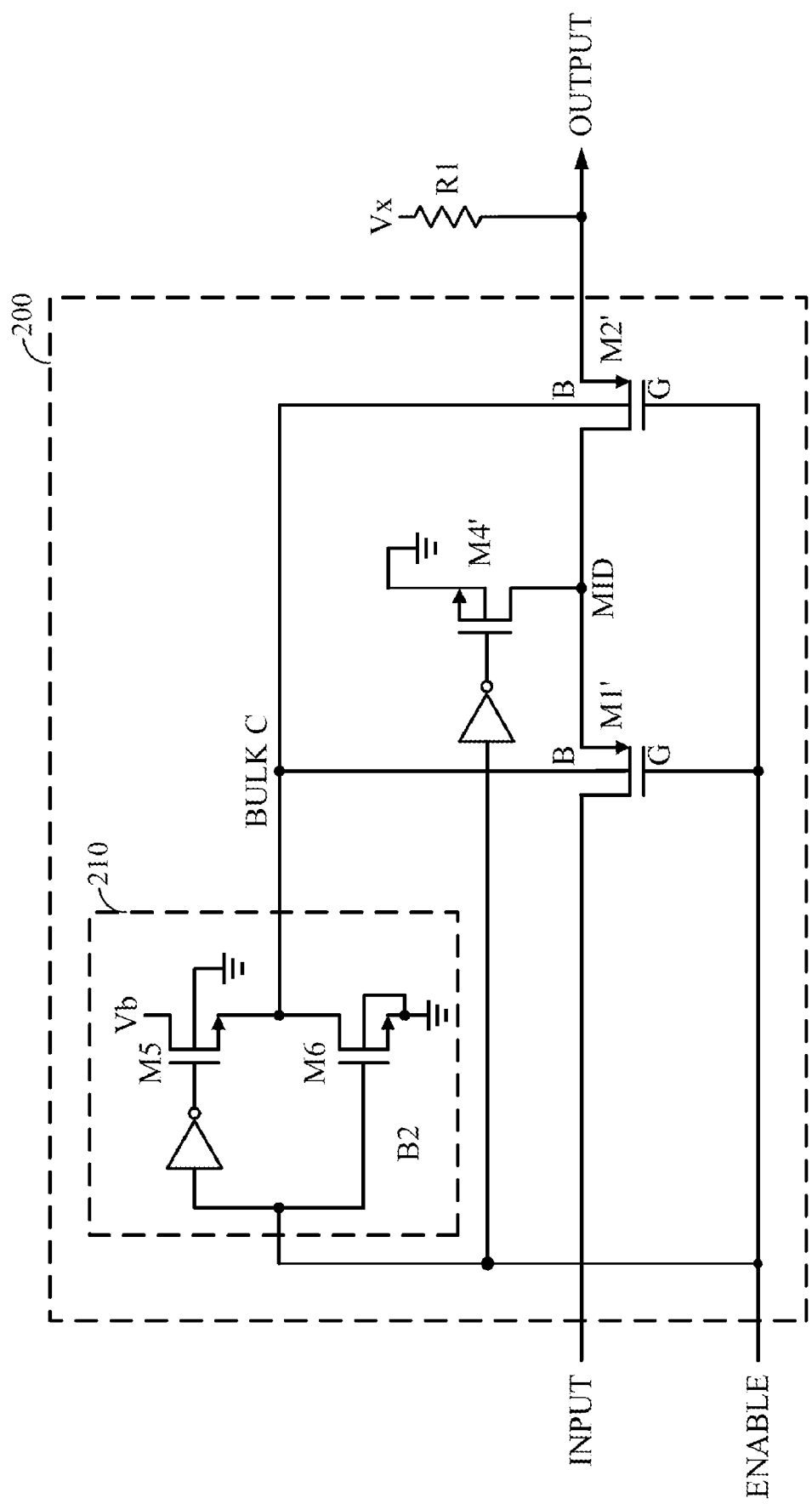
FIG. 4 depicts an alternative embodiment of a switch 200 according to the present disclosure.

In an alternative exemplary embodiment illustrated in FIG. 4, PMOS devices M1' and M2' may be used for switch transistors, and an NMOS device M4' used to pull the corresponding node MID in such an alternative embodiment to ground. One of ordinary skill in the art may readily derive the appropriate modifications to the circuitry depicted in FIG. 2 to realize such an alternative exemplary embodiment.

In alternative exemplary embodiments (not shown), the functionality of bulk generation voltage module 210 may be implemented using alternative transistor configurations known to one of ordinary skill in the art. For example, PMOS transistors, or a combination of NMOS and PMOS transistors, may be used. Such alternative exemplary embodiments are contemplated to be within the scope of the present disclosure.

Figure 3:
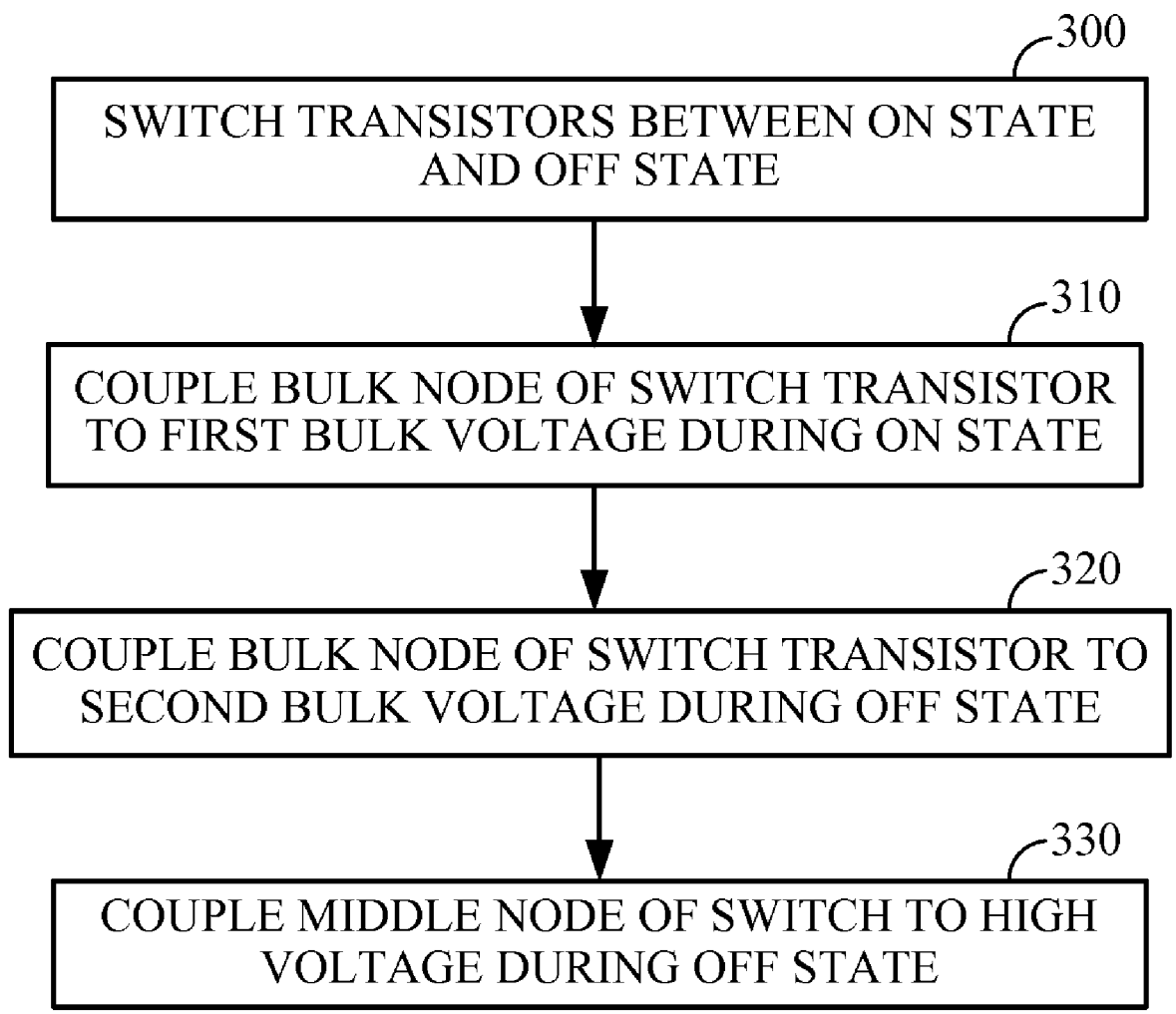
FIG. 3 depicts an exemplary method according to the present disclosure.

FIG. 3 depicts an exemplary method according to the present disclosure. Note the method of FIG. 3 is provided for illustration only, and is not meant to restrict the scope of the present disclosure to any exemplary embodiment explicitly disclosed.

In FIG. 3, at step 300, the method switches the switch transistors (e.g., M1 and M2 in FIG. 2) between an on state and an off state.

At step 310, the method couples the bulk node of a switch transistor to a first bulk voltage during the on state of the switch.

At step 320, the method couples the bulk node of a switch transistor to a second bulk voltage during the off state of the switch. In an exemplary embodiment wherein the switch transistors are NMOS devices, the second bulk voltage may be lower than the first bulk voltage.

At step 330, the method couples a middle node of the switch to a high voltage during the off state.

In this specification and in the claims, it will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements present.

A number of aspects and examples have been described. However, various modifications to these examples are possible, and the principles presented herein may be applied to other aspects as well. These and other aspects are within the scope of the following claims.

The invention claimed is:

1. An analog switch for coupling a first node to a second node during an on state, and for isolating the first node from the second node during an off state, the switch comprising:
   first and second switch transistors, the first switch transistor coupling the first node to a middle node, the second switch transistor coupling the middle node to the second node;
   a bulk voltage generation module coupling the bulk node of the first and second switch transistors to a first bulk voltage during the on state, and to a second bulk voltage during the off state, comprising:
      a first module transistor coupling the bulk node of the first and second switch transistors to the first bulk voltage during the on state; and
      a second module transistor coupling the bulk node of the first and second switch transistors to the second bulk voltage during the off state.

2. The switch of claim 1, the first and second switch transistors each being an NMOS transistor.

3. The switch of claim 2, further comprising a pull transistor coupling the middle node to a high voltage during the off state.

4. The switch of claim 3, the pull transistor being turned off during the on state.

5. The switch of claim 2, the second bulk voltage being a ground voltage, the first bulk voltage being higher than the ground voltage.

6. The switch of claim 5, wherein the first and second module transistors are NMOS transistors.

7. The switch of claim 5, the first bulk voltage being approximately half a supply voltage.

8. The switch of claim 1, the first and second switch transistors each being a PMOS transistor, the bulk voltage generation module coupling the bulk nodes of both the first and second switch transistors to the first bulk voltage during the on state.

9. The switch of claim 8, the second bulk voltage being a high voltage, the first bulk voltage being lower than the high voltage.

10. The switch of claim 9, further comprising an NMOS pull transistor coupling the middle node to a low voltage during the off state, the pull transistor being turned off during the on state.

11. A method for coupling a first node to a second node during an on state, and for isolating the first node from the second node during an off state, the method comprising:
switching first and second switch transistors, the first switch transistor coupling the first node to a middle node, the second switch transistor coupling the middle node to the second node;
coupling the bulk node of the first and second switch transistors to a first bulk voltage during the on state;
coupling the bulk node of the the first and second switch transistors to a second bulk voltage during the off state; and
generating the first and second bulk voltages via a bulk voltage generation unit, the bulk voltage generation unit comprising a first module transistor to couple the bulk node of the first and second switch transistors to the first bulk voltage during the on state, and a second module transistor to couple the bulk node of the first and second switch transistors to the second bulk voltage during the off state.

12. The method of claim 11, the first and second switch transistors each being an NMOS transistor.

13. The method of claim 12, further comprising coupling the middle node to a high voltage during the off state.

14. The method of claim 12, the second bulk voltage being a ground voltage, the first bulk voltage being higher than the ground voltage.

15. The method of claim 14, the first bulk voltage being approximately half a supply voltage.

16. The method of claim 14, the coupling the at least one of the first and second switch transistors comprising:
coupling the bulk node of the at least one of the first and second switch transistors to the first bulk voltage during the on state using a first NMOS module transistor; and
coupling the bulk node of the at least one of the first and second switch transistors to the second bulk voltage during the off state using a second NMOS module transistor.

17. The method of claim 11, the first and second switch transistors each being a PMOS transistor, the method comprising coupling the bulk nodes of both the first and second switch transistors to the first bulk voltage during the on state.

18. The method of claim 17, the second bulk voltage being a high voltage, the first bulk voltage being lower than the high voltage.

19. The method of claim 18, further comprising coupling the middle node to a low voltage during the off state.

20. An analog switch for coupling a first node to a second node during an on state, and for isolating the first node from the second node during an off state, the switch comprising first and second switch transistors, the first switch transistor coupling the first node to a middle node, the second switch transistor coupling the middle node to the second node, the switch further comprising:
bulk voltage generation means for varying the threshold voltage of the first and second switch transistors to reduce the threshold voltage during the on state, comprising:
means for coupling a bulk node of the first and a bulk node of second switch transistors to a first bulk voltage during the on state; and
means for coupling the bulk nodes of the first and second switch transistors to the second bulk voltage during the off state.

21. The switch of claim 20, the switch further comprising:
pulling means for pulling the middle node to a DC voltage during the off state.

* * * * *